United States Patent
Nakayama

(10) Patent No.: US 10,153,720 B2
(45) Date of Patent: Dec. 11, 2018

(54) POWER SUPPLY SYSTEM FOR ELECTRIC VEHICLE

(71) Applicant: TOYOTA JIDOSHA KABUSHIKI KAISHA, Toyota-shi, Aichi-ken (JP)

(72) Inventor: Wataru Nakayama, Miyoshi (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 15/843,457

(22) Filed: Dec. 15, 2017

(65) Prior Publication Data

US 2018/0175774 A1 Jun. 21, 2018

(30) Foreign Application Priority Data

Dec. 20, 2016 (JP) .................. 2016-246874

(51) Int. Cl.
| | |
|---|---|
| *B60L 1/02* | (2006.01) |
| *H02P 29/60* | (2016.01) |
| *H02P 3/22* | (2006.01) |
| *H02P 27/06* | (2006.01) |
| *H02P 29/68* | (2016.01) |
| *H02M 3/158* | (2006.01) |
| *G01K 13/00* | (2006.01) |

(Continued)

(52) U.S. Cl.
CPC .............. *H02P 27/06* (2013.01); *B60L 7/10* (2013.01); *B60L 11/1864* (2013.01); *G01K 13/00* (2013.01); *G01R 31/006* (2013.01); *G01R 31/3606* (2013.01); *H02M 1/32* (2013.01); *H02M 3/158* (2013.01); *H02M 3/1584* (2013.01); *H02P 29/68* (2016.02); *H05K 7/2089* (2013.01); *B60L 2210/10* (2013.01); *H02M 2001/327* (2013.01)

(58) Field of Classification Search
CPC ............... B60L 11/12; B60L 9/16; H02P 7/18
See application file for complete search history.

(56) References Cited

U.S. PATENT DOCUMENTS

| | | | |
|---|---|---|---|
| 2001/0026141 A1* | 10/2001 | Hirata | .................... B60K 6/485 |
| | | | 318/727 |
| 2009/0167234 A1* | 7/2009 | Uechi | .................... H02P 29/68 |
| | | | 318/800 |

(Continued)

FOREIGN PATENT DOCUMENTS

| | | |
|---|---|---|
| CN | 103036433 A | 4/2013 |
| JP | 2009-159748 A | 7/2009 |

(Continued)

*Primary Examiner* — Bickey Dhakal
*Assistant Examiner* — Charles S Laughlin
(74) *Attorney, Agent, or Firm* — Sughrue Mion, PLLC

(57) ABSTRACT

A power supply system for an electric vehicle includes a battery, an inverter configured to supply alternating-current electric power to a motor for traveling, a first voltage converter connected between the battery and the inverter, a second voltage converter connected in parallel with the first voltage converter, a temperature acquisition unit configured to acquire a temperature of the first voltage converter, a current acquisition unit configured to acquire magnitude of a current flowing in the second voltage converter, and a controller. Each of the first voltage converter and the second voltage converter includes two switching elements, two diodes, and a reactor.

3 Claims, 4 Drawing Sheets

(51) Int. Cl.
　　　*G01R 31/36*　　　(2006.01)
　　　*G01R 31/00*　　　(2006.01)
　　　*H05K 7/20*　　　(2006.01)
　　　*B60L 7/10*　　　(2006.01)
　　　*B60L 11/18*　　　(2006.01)
　　　*H02M 1/32*　　　(2007.01)

(56) References Cited

U.S. PATENT DOCUMENTS

| | | | |
|---|---|---|---|
| 2010/0123441 A1* | 5/2010 | Kim | H02M 3/158 |
| | | | 323/272 |
| 2010/0244558 A1* | 9/2010 | Mitsutani | B60K 6/365 |
| | | | 307/9.1 |
| 2012/0013182 A1* | 1/2012 | Minegishi | B60W 20/10 |
| | | | 307/9.1 |

FOREIGN PATENT DOCUMENTS

| | | |
|---|---|---|
| JP | 2012029487 A | 2/2012 |
| JP | 2016-100936 A | 5/2016 |
| JP | 2017-085697 A | 5/2017 |

\* cited by examiner

POWER SUPPLY SYSTEM FOR ELECTRIC VEHICLE

INCORPORATION BY REFERENCE

The disclosure of Japanese Patent Application No. 2016-246874 filed on Dec. 20, 2016 including the specification, drawings and abstract is incorporated herein by reference in its entirety.

BACKGROUND

1. Technical Field

The present disclosure relates to a power supply system that supplies electric power to a motor for traveling of an electric vehicle. In the specification, an "electric vehicle" includes a hybrid vehicle including both of a motor and an engine.

2. Description of Related Art

An electric vehicle includes a power supply system including a battery, and an inverter configured to convert direct-current electric power of the battery to alternating-current electric power for motor driving. As an example of the power supply system described above, a power supply system in which a voltage converter is provided between a battery and an inverter is known (Japanese Unexamined Patent Application Publication No. 2009-159748 (JP 2009-159748 A), Japanese Unexamined Patent Application Publication No. 2016-100936 (JP 2016-100936 A)). In many electric vehicles, electric power is generated with a motor using inertia energy of a vehicle upon braking, the inverter converts the electric power (regenerative electric power) to a direct current, and the battery is charged. For this reason, the voltage converter of the power supply system needs to have both of a boost function of boosting a voltage of the battery and outputting the voltage to the inverter and a deboost function of deboosting a voltage of regenerative electric power supplied from the inverter and outputting the voltage to the battery. The voltage converter described above is called a bidirectional DC-DC converter.

A typical bidirectional DC-DC converter includes two switching elements, two diodes, and a reactor. The two switching elements are connected in series between a positive electrode end and a negative electrode end of the inverter. The diodes are connected in reversely parallel with the switching elements, respectively. The reactor is connected between a positive electrode end of the battery and a midpoint of series connection of the two switching elements. A controller controls the switching elements. Hereinafter, for convenience of description, the switching element on the positive electrode end side of the two switching elements connected in series is referred to as an upper arm element, and the switching element on the negative electrode end side is referred to as a lower arm element.

The voltage converter of the power supply system disclosed in each of JP 2009-159748 A and JP 2016-100936 A also includes the above-described circuit configuration. The controller supplies a drive signal to each switching element. The drive signal is typically a pulse width modulation (PWM) signal with a predetermined duty ratio. The voltage converter of the power supply system of JP 2009-159748 A limits an on and off operation of the lower arm element when the temperature of the reactor becomes high and suppresses a current flowing in the reactor. In the power supply system of JP 2016-100936 A, in order to suppress a load of a part of the voltage converter, two voltage converters are connected in parallel with each other. JP 2016-100936 A also describes that there is a case where the upper arm element is fixed to be on and the lower arm element is fixed to be off. In this case, the voltage converter outputs the voltage of the battery to the inverter side as it is. Hereinafter, for convenience of description, control for fixing the upper arm element to be on and fixing the lower arm element to be off is referred to as upper arm on fixing control.

SUMMARY

In a case of the power supply system in which the two voltage converters are connected in parallel with each other between the battery and the inverter, there is a case where the temperature of a first voltage converter becomes higher than the temperature of a second voltage converter due to an individual difference or the like of the voltage converters. Examples of the individual difference of the voltage converters include a performance difference of coolers attached to the voltage converters, a difference in rated current, and the like. The specification provides a technique that, in a power supply system in which the pair of voltage converters are connected to each other in parallel, when control (upper arm on fixing control) for fixing an upper arm element to be on and fixing a lower arm element to be off is performed and a temperature of one voltage converter becomes excessively high, further suppresses an increase in temperature of the voltage converter without causing a decrease in electric power supplied to an inverter (motor) as much as possible.

An aspect of the present disclosure relates to a power supply system for an electric vehicle including a battery, an inverter, a first voltage converter, a second voltage converter, and a controller. The inverter is configured to supply alternating-current electric power to a motor for generating a driving force for the electric vehicle. The first voltage converter is provided between the battery and the inverter, and is connected to the battery and the inverter. The second voltage converter is provided between the battery and the inverter, the second voltage is connected to the battery and the inverter, and the second voltage is in parallel with the first voltage converter. Each of the first voltage converter and the second voltage converter includes a pair of first and second switching elements, two diodes, and a reactor. The pair of the first and second switching elements are provided between a positive electrode end and a negative electrode end of the inverter, the first switching element is connected to a positive electrode end of the inverter and the second switching element is connected to a negative electrode end of the inverter. The two diodes are connected in reversely parallel with the switching elements, respectively. The reactor is connected to a positive electrode end of the battery and a point at which the first and second switching elements are connected to each other. As described above, the first switching element connected to the positive electrode end of the inverter corresponds to an upper arm element, and the second switching element connected to the negative electrode end of the inverter corresponds to the lower arm element.

In the aspect of the present disclosure, the power supply system further includes a temperature acquisition unit configured to a temperature of the first voltage converter, and a current acquisition unit configured to acquire magnitude of a current flowing in the second voltage converter. The controller is configured to, when upper arm on fixing control is performed, monitor the temperature of the first voltage converter and the current flowing in the second voltage converter and perform control of (1) and (2) described below. (1) When the temperature of the first voltage converter becomes higher than a temperature threshold and the current flowing in the second voltage converter is higher than a current threshold, continue the upper arm on fixing control on the first and second voltage converters and reduce an output of the battery. (2) When the temperature of the first voltage converter becomes higher than the temperature threshold and the current flowing in the second voltage converter is lower than the current threshold, the controller is configured to release the upper arm on fixing control on the first voltage converter. Then, the controller is configured to start a first switching control for switching the second switching element of the first voltage converter with a first duty ratio and switching the first switching element of the first voltage converter so as to become a reverse operation of an on and off operation of the second switching element of the first voltage converter. The controller is configured to continue the upper arm on fixing control on the second voltage converter or release the upper arm on fixing control on the second voltage converter and start the following second switching control. The second switching control is control for switching the second switching element of the second voltage converter with a second duty ratio smaller than the first duty ratio and switching the first switching element of the second voltage converter so as to become a reverse operation of an on and off operation of the second switching element of the second voltage converter. The first switching element is switched so as to become the reverse operation of the on and off operation of the second switching element, whereby, when regenerative electric power is generated, it is possible to allow the voltage converter to deboost a voltage of regenerative electric power supplied from the inverter and to output the voltage to the battery. The first duty ratio may be arbitrarily selected to a value other than zero. The second duty ratio may be arbitrarily selected as long as the value is smaller than the first duty ratio.

With the processing of (2), a current flowing in the first voltage converter decreases, and the current flowing in the second voltage converter is increased by the amount of decrease. Since the current flowing in the first voltage converter decreases, it is possible to further suppress an increase in temperature of the first voltage converter. Since the amount of decrease of output electric power of the first voltage converter is supplemented with the second voltage converter, electric power supplied to the inverter (motor) does not decrease, and traveling performance of a vehicle is not deteriorated. When the current flowing in the second voltage converter is equal to the current threshold may be arbitrarily allocated to one of (1) and (2).

A reason that the current flowing in the first voltage converter decreases with the processing of (2) is as follows. In a case where the upper arm on fixing control is released and the first switching control on the first voltage converter is started, the direction of the current is changed by switching, the current becomes an alternating current, and as a result, the current decreases due to self-inductance of the reactor. Monitoring the current without monitoring the temperature of the second voltage converter is to prevent an overcurrent from flowing in the second voltage converter instantly and to know a load of the second voltage converter. This is because, in a case where there is a margin in the load of the second voltage converter (that is, in a case where the current flowing in the second voltage converter is smaller than the current threshold), the amount of decrease of an output of the first voltage converter is supplemented with the second voltage converter.

When the current flowing in the second voltage converter is higher than the current threshold (that is, when the load of the second voltage converter is large), since output electric power that decreases with the first voltage converter cannot be supplemented with the second voltage converter, in this case, the processing of (1) is performed, and the currents flowing in the first voltage converter and the second voltage converter are appropriately suppressed. In this case, a decrease in electric power supplied to the inverter (motor) is permitted. In a case where the first voltage converter is overheated, the power supply system decreases the current flowing in the first voltage converter, supplements the amount of decrease of output electric power of the first voltage converter with the second voltage converter where possible, and maintains a total output of the two voltage converters.

In the power supply system according to the aspect of the present disclosure, the first voltage converter may include part temperature acquisition units configured to acquire temperatures of a plurality of parts. In a case where the temperature of one of the parts becomes higher than the temperature threshold corresponding to the part, the controller may be configured to handle the temperature of the part as the temperature of the first voltage converter. With such a configuration, it is possible to protect a plurality of parts of the first voltage converter against overheating.

In the power supply system according to the aspect of the present disclosure, the temperature of the first voltage converter may tend to become higher than a temperature of the second voltage converter. For example, there is a case where the first voltage converter is likely to become higher in temperature than the second voltage converter due to a performance difference of coolers attached to the voltage converters, a difference in rated current, or the like.

The details and further improvements of the present disclosure will be described in DETAILED DESCRIPTION OF EMBODIMENTS.

BRIEF DESCRIPTION OF THE DRAWINGS

Features, advantages, and technical and industrial significance of exemplary embodiments will be described below with reference to the accompanying drawings, in which like numerals denote like elements, and wherein.

DETAILED DESCRIPTION OF EMBODIMENTS

Figure 1:
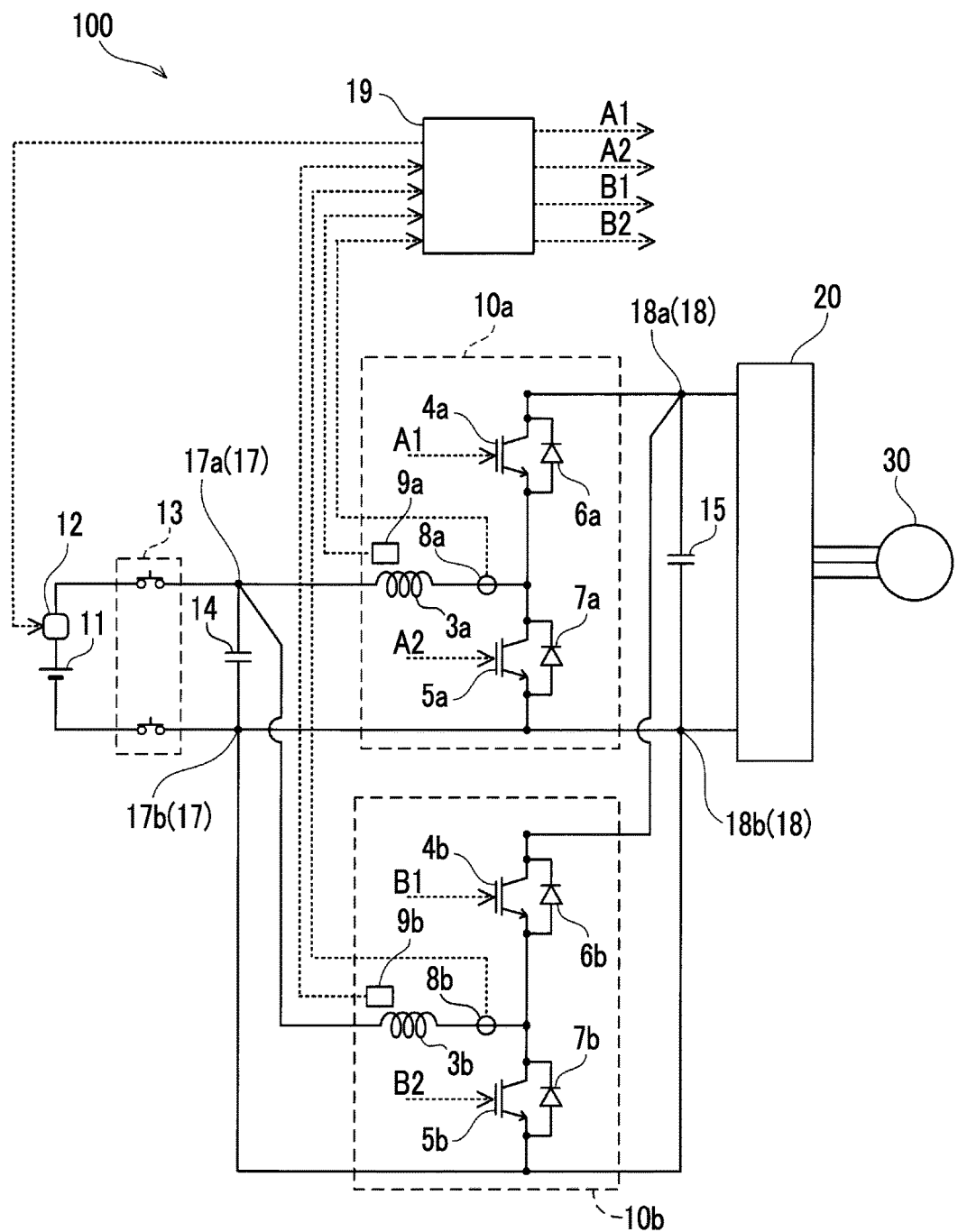
FIG. 1 is a block diagram of an electric power system of an electric vehicle including a power supply system of an example.

A power supply system 100 of an example will be described referring to the drawings. FIG. 1 is a block diagram of an electric power system of an electric vehicle including a power supply system 100. In FIG. 1, a system excluding a motor 30 for traveling is the power supply system 100. The power supply system 100 of the example includes a battery 11, a system main relay 13, two voltage converters 10a, 10b, and an inverter 20. The motor 30 is driven with electric power of the battery 11, and the electric vehicle travels. The inverter 20 converts direct-current electric power of the battery 11 to alternating-current electric power and supplies alternating-current electric power to the motor 30.

The first voltage converter 10a is connected between the battery 11 and the inverter 20. The second voltage converter 10b is connected between the battery 11 and the inverter 20 in parallel with the first voltage converter 10a. The system main relay 13 is connected between the first and second voltage converters 10a, 10b and the battery 11. The system main relay 13, the first and second voltage converters 10a, 10b, and the inverter 20 are controlled by a controller 19. In FIG. 1, although the controller 19 is drawn in a single rectangular shape, the functions of the controller 19 may be realized by cooperation of a plurality of processors. In FIG. 1, although arrow dotted lines represent signal lines, a signal between the controller 19 and the system main relay 13 and a signal line between the controller 19 and the inverter 20 are not shown. The controller 19 closes the system main relay 13 in a case where a main switch (not shown) of the vehicle is turned on. The controller 19 opens the system main relay 13 in a case where the main switch of the vehicle is turned off.

A current limiter 12 is provided at an output end of the battery 11. The current limiter 12 limits an output current of the battery 11 to be equal to or less than a predetermined value according to a command from the controller 19. Usually, the controller 19 does not operate the current limiter 12, and the battery 11 is allowed to output a maximum output current. A case where the current limiter 12 is used will be described below.

The first voltage converter 10a and the second voltage converter 10b are connected in parallel with each other, a terminal of each of the first voltage converter 10a and the second voltage converter 10b on the battery side is referred to as a low voltage end 17, and a terminal of each voltage converter on the inverter side is referred to as a high voltage end 18. In other words, the low voltage end 17 and the high voltage end 18 are common to the two voltage converters 10a, 10b. A negative electrode end 17b of the low voltage end 17 and a negative electrode end 18b of the high voltage end 18 are connected directly to each other.

A filter capacitor 14 is connected between a positive electrode end 17a and the negative electrode end 17b of the low voltage end 17, and a smoothing capacitor 15 is connected between a positive electrode end 18a and the negative electrode end 18b of the high voltage end 18.

The circuit of the first voltage converter 10a will be described. Two transistors 4a, 5a are connected in series with each other between the positive electrode end 18a and the negative electrode end 18b of the high voltage end 18. Two diodes 6a, 7a in total are connected in reversely parallel with the transistors 4a, 5a one by one. A reactor 3a is connected between a midpoint of series connection of the two transistors 4a, 5a and the positive electrode end 17a of the low voltage end 17. The transistors 4a, 5a are, for example, insulated gate bipolar transistors (IGBT). Hereinafter, the transistor 4a on the positive electrode end 18a side of the two transistors 4a, 5a connected in series with each other may be referred to as an upper arm transistor 4a, and the transistor 5a on the negative electrode end 18b side may be referred to as a lower arm transistor 5a.

The first voltage converter 10a is a bidirectional DC-DC converter that has a boost function of boosting a voltage of electric power applied to the low voltage end 17 and outputting the voltage to the high voltage end 18, and a deboost function of deboosting a voltage of electric power applied to the high voltage end 18 and outputting the voltage to the low voltage end 17. A deboost operation is realized by an on and off operation of the upper arm transistor 4a, and a boost operation is realized by an on and off operation of the lower arm transistor 5a. A voltage ratio of the high voltage end 18 to the voltage of the low voltage end 17 is determined by a duty ratio of a drive signal applied to each of the transistors 4a, 5a. The transistors 4a, 5a are controlled by the controller 19. The controller 19 makes the lower arm transistor 5a perform the on and off operation with a predetermined duty ratio based on a target voltage ratio of the high voltage end 18 to the voltage of the low voltage end 17. At this time, the controller 19 switches the transistors 4a, 5a such that the upper arm transistor 4a is turned off when the lower arm transistor 5a is turned on, and the upper arm transistor 4a is turned on when the lower arm transistor 5a is turned off. In other words, the controller 19 switches the lower arm transistor 5a with a predetermined duty ratio and switches the upper arm transistor 4a so as to become a reverse operation of the on and off operation of the lower arm transistor 5a. As described above, in the electric vehicle, the motor 30 may generate electric power with deceleration energy of the vehicle. The controller 19 performs switching control of the two transistors 4a, 5a such that the second transistor is turned off (on) when the first transistor is turned on (off). With the above description, in a case where there is no regenerative electric power, a voltage of electric power of the battery 11 is boosted and supplied to the inverter 20, and in a case where regenerative electric power is generated, regenerative electric power supplied from the inverter 20 is deboosted and flows into the battery 11. The upper arm transistor 4a is made to perform the reverse operation of the operation of the lower arm transistor 5a, and boosting and deboosting are switched passively according to the presence or absence of regenerative electric power. The above description is excellent in that the controller 19 can control the voltage converters without distinction between powering and regeneration. The term "powering" means a state in which the motor is driven with electric power of the battery, and the term "regeneration" means a state in which the motor is driven reversely from an axle side and generates electric power.

The first voltage converter 10a is provided with a temperature sensor 9a and a current sensor 8a. The temperature sensor 9a measures a temperature of the reactor 3a. The current sensor 8a measures a current flowing in the reactor 3a, that is, the magnitude of a current flowing in the first voltage converter 10a.

The second voltage converter 10b has the same circuit configuration as that of the first voltage converter 10a. Two transistors 4b, 5b are connected in series with each other between the positive electrode end 18a and the negative electrode end 18b of the high voltage end 18. Two diodes 6b, 7b in total are connected in reversely parallel with the two transistors 4b, 5b one by one. A reactor 3b is connected between a midpoint of series connection of the two transistors 4b, 5b and the positive electrode end 17a of the low voltage end 17. The transistors 4b, 5b are, for example, insulated gate bipolar transistors (IGBT). The transistor 4b on the positive electrode end 18a side of the two transistors 4b, 5b connected in series with each other may be referred to as an upper arm transistor 4b, and the transistor 5b on the negative electrode end 18b side may be referred to as a lower arm transistor 5b. The second voltage converter 10b is provided with a temperature sensor 9b and a current sensor 8b. The temperature sensor 9b measures a temperature of the reactor 3b. The current sensor 8b measures a current flowing in the reactor 3b, that is, the magnitude of a current flowing in the second voltage converter 10b.

Similarly to the first voltage converter 10a, the controller 19 performs switching control of the upper arm transistor 4b and the lower arm transistor 5b of the second voltage converter 10b such that the second transistor is turned off (on) when the first transistor is turned on (off).

Usually, the controller 19 switches the lower arm transistor 5a of the first voltage converter 10a and the lower arm transistor 5b of the second voltage converter 10b with the same duty ratio. As described above, the duty ratio is determined based on the target voltage ratio of the high voltage end 18 to the voltage of the low voltage end 17. Since the upper arm transistor is controlled so as to become the reverse operation of the lower arm transistor, the upper arm transistor 4a of the first voltage converter 10a and the upper arm transistor 4b of the second voltage converter 10b are switched at the same timing.

The controller 19 determines a target output of the motor 30 from an accelerator operation amount and a vehicle speed, and determines the target voltage ratio of each of the first and second voltage converters 10a, 10b from the target output. The controller 19 determines the duty ratio of each of the lower arm transistors 5a, 5b of the first and second voltage converters 10a, 10b based on the corresponding target voltage ratio. The larger the target voltage ratio, the larger the duty ratio of each of the lower arm transistors 5a, 5b becomes.

In FIG. 1, reference numeral A1 indicates a drive signal to the upper arm transistor 4a of the first voltage converter 10a, and reference numeral A2 indicates the drive signal to the lower arm transistor 5a of the first voltage converter 10a. Reference numeral B1 indicates a drive signal to the upper arm transistor 4b of the second voltage converter 10b, and reference numeral B2 indicates a drive signal to the lower arm transistor 5b of the second voltage converter 10b.

Usually, the lower arm transistors 5a, 5b of the first voltage converter 10a and the second voltage converter 10b are subjected to switching control with the same duty ratio. The first voltage converter 10a and the second voltage converter 10b have the same specification, and in a case where the target voltage ratio is identical, the first voltage converter 10a and the second voltage converter 10b are driven with the same duty ratio. Though details will be described below, when the temperature of one voltage converter is likely to become excessively high, the two voltage converters 10a, 10b may be subjected to switching control with different duty ratios.

In a case where the target output of the motor 30 is relatively small, such as a case where the accelerator operation amount is relatively small, the controller 19 may drive the first and second voltage converters 10a, 10b such that the target voltage ratio=1. The target voltage ratio=1 means fixing the upper arm transistor 4a (4b) to be on and fixing the lower arm transistor 5a (5b) to be off. Hereinafter, control in which the controller 19 fixes the upper arm transistor 4a (4b) to be on and fixes the lower arm transistor 5a (5b) to be off is referred to as upper arm on fixing control. In a case where the target output of the motor 30 is relatively small, the controller 19 performs upper arm on fixing control on the first voltage converter 10a and the second voltage converter 10b.

The first voltage converter 10a tends to easily become higher in temperature than the second voltage converter 10b.

For example, the first voltage converter 10a tends to easily become higher in temperature than the second voltage converter 10b due to a difference in performance of coolers attached to the converters, a difference in rated current, or the like. In a case of the voltage converter of the example, the reactor has a severer thermal condition than other parts, and the temperature of the reactor represents the temperature of the voltage converter. For this reason, the first voltage converter 10a includes the temperature sensor 9a that measures the temperature of the reactor 3a, and the second voltage converter 10b includes the temperature sensor 9b that measures the temperature of the reactor 3b. Measurement values of the temperature sensors 9a, 9b are sent to the controller 19. Now, a situation in which the temperature (the temperature of the reactor 3a) of the first voltage converter 10a is higher than the temperature (the temperature of the reactor 3b) of the second voltage converter 10b is assumed. In a case where the temperature of the reactor 3a of the first voltage converter 10a is higher than a predetermined temperature threshold, the controller 19 decreases the current flowing in the reactor 3a to be smaller and further suppresses an increase in temperature of the reactor 3a. At this time, the controller 19 supplements the amount of decrease of the current flowing in the reactor 3a (the amount of decrease of electric power output from the first voltage converter 10a) with the second voltage converter 10b where possible. The amount of decrease of the output of the first voltage converter 10a is supplemented with the second voltage converter 10b, thereby avoiding deterioration of traveling performance.

When the upper arm on fixing control is performed on the first voltage converter 10a and the second voltage converter 10b, in a case where the temperature of the reactor 3a of the first voltage converter 10a becomes higher than the predetermined temperature threshold, the controller 19 performs processing of one of (1) and (2) described below. (1) In a case where the temperature (the temperature of the reactor 3a) of the first voltage converter 10a becomes higher than the temperature threshold and the current flowing in the second voltage converter 10b is higher than a current threshold, the upper arm on fixing control is continued on the first and second voltage converters 10a, 10b and the output of the battery 11 is reduced. (2) In a case where the temperature (the temperature of the reactor 3a) of the first voltage converter 10a becomes higher than the temperature threshold and the current flowing in the second voltage converter 10b is lower than the current threshold, the upper arm on fixing control on the first voltage converter 10a is released, and switching control (first switching control) for switching the lower arm transistor 5a of the first voltage converter 10a with a first duty ratio and switching the upper arm transistor 4a of the first voltage converter 10a so as to become the reverse operation of the on and off operation of the lower arm transistor 5a is started. At this time, the controller 19 continues the upper arm on fixing control on the second voltage converter 10b. The current flowing in the second voltage converter 10b is measured by the current sensor 8b (see FIG. 1). The output of the battery 11 is limited by the current limiter 12 (see FIG. 1).

In the processing of (1), since the output of the battery 11 is appropriately suppressed, electric power supplied to both of the first voltage converter 10a and the second voltage converter 10b is appropriately suppressed. As a result, an increase in temperature of the first voltage converter 10a is further suppressed. However, in this case, since the total output of the first voltage converter 10a and the second voltage converter 10b decreases, a decrease of electric power supplied to the inverter 20, that is, the output of the motor 30 has to be permitted.

In the processing of (2), the current flowing in the first voltage converter 10a is appropriately suppressed, and electric power flowing in the second voltage converter 10b increases by the amount of suppression. As a result, the total output of the first voltage converter 10a and the second voltage converter 10b is maintained, and the output of the motor 30 is also maintained.

In the processing of (2), the reason that the current flowing in the reactor 3a decreases in a case where a switching operation of the first voltage converter 10a starts is as follows. That is, in a case where the upper arm on fixing control is released and the first switching control is started on the first voltage converter 10a, the direction of the current is changed by switching, and the current becomes an alternating current. As a result, the current decreases due to self-inductance of the reactor. The first duty ratio of the lower arm transistor 5a may be arbitrary.

In the processing of (2), monitoring a current IL2 without monitoring the temperature (the temperature of the reactor 3b) of the second voltage converter 10b is to prevent an overcurrent from flowing in the second voltage converter 10b instantly and to know a load of the second voltage converter 10b. This is because, in a case where there is a margin in the load of the second voltage converter 10b (that is, in a case where the current flowing in the second voltage converter 10b is smaller than the current threshold), the amount of decrease of the output of the first voltage converter 10a is supplemented with the second voltage converter 10b.

In the processing of (2), instead of continuing the upper arm on fixing control on the second voltage converter 10b, the controller 19 may release the upper arm on fixing control and may start switching control (second switching control) for switching the lower arm transistor 5b of the second voltage converter 10b with a second duty ratio smaller than the first duty ratio and switching the upper arm transistor 4b of the second voltage converter 10b so as to become a reverse operation of the on and off operation of the lower arm transistor 5b. This will be described below.

Figure 2:
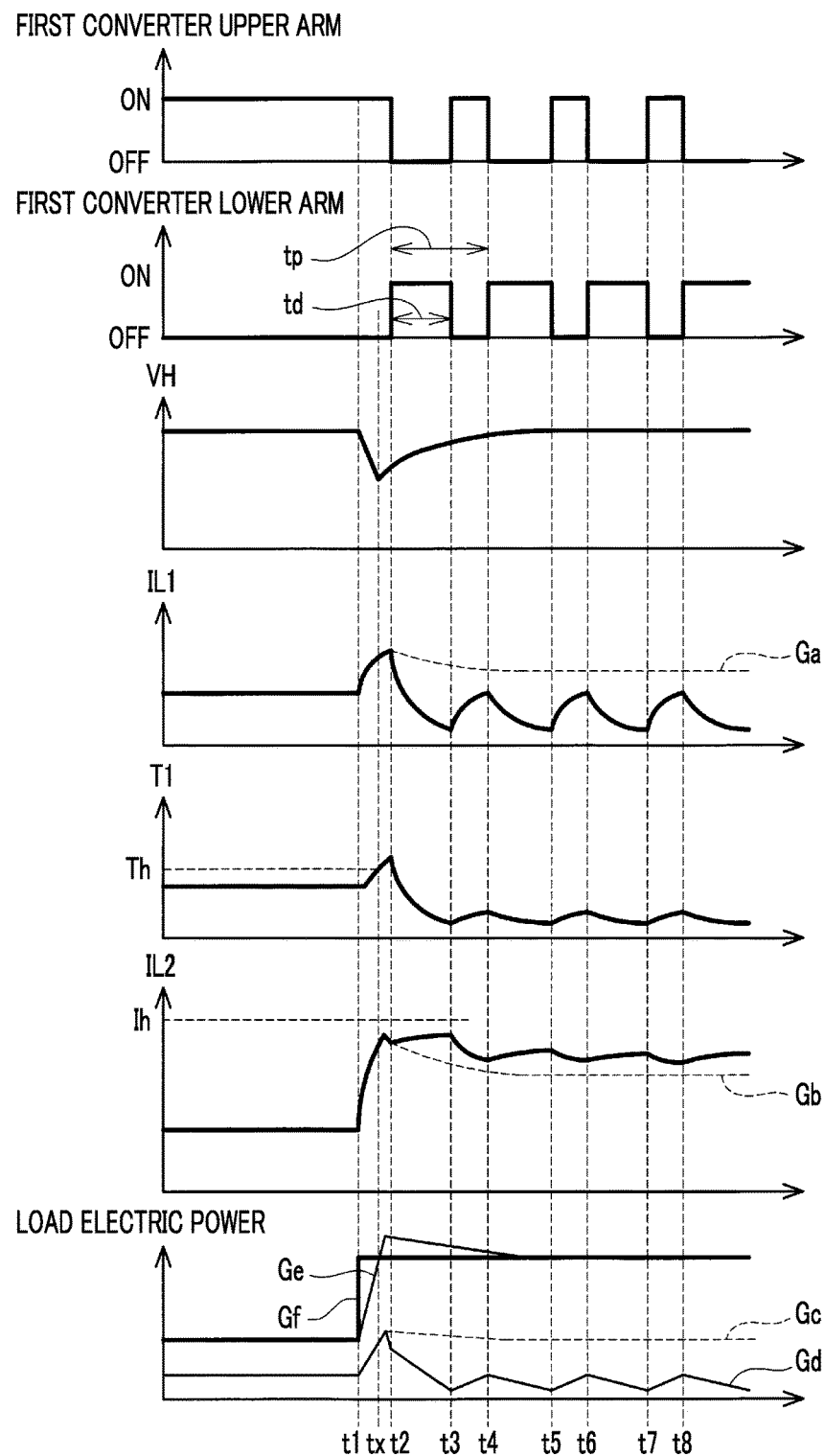
FIG. 2 is a time chart of operations of first and second voltage converters when a temperature of a reactor of the first voltage converter exceeds a temperature threshold.

The operation of (2) will be described referring to FIG. 2 in connection with a specific example. FIG. 2 is a time chart of the operations of the first and second voltage converters 10a, 10b when the temperature of the reactor 3a of the first voltage converter 10a exceeds the temperature threshold. A first view from above of FIG. 2 shows a time chart of the operation of the upper arm transistor 4a of the first voltage converter 10a. A second view from above of FIG. 2 shows a time chart of the operation of the lower arm transistor 5a of the first voltage converter 10a. In the second voltage converter 10b, since the upper arm on fixing control is continued, a time chart is omitted.

A third view from above of FIG. 2 shows change in voltage VH of the high voltage end 18 (see FIG. 1) of the first voltage converter 10a and the second voltage converter 10b. A fourth view from above of FIG. 2 shows temporal change in current IL1 flowing in the reactor 3a of the first voltage converter 10a. A third view from below of FIG. 2 shows temporal change in temperature T1 of the reactor 3a of the first voltage converter 10a. A second view from below of FIG. 2 shows temporal change in current IL2 flowing in the reactor 3b of the second voltage converter 10b. A first view from below of FIG. 2 shows temporal change in electric power of the load (motor). The horizontal axis represents time.

A thick line graph Gf in the first view from below of FIG. 2 shows load electric power (the output of the motor 30). Up to time t1, since load electric power is comparatively small, the controller 19 performs the upper arm on fixing control on the first voltage converter 10a and the second voltage converter 10b. Now, it is assumed that, at time t1, load electric power increases. Since load electric power increases, the current IL1 flowing in the reactor 3a of the first voltage converter 10a and the current IL2 flowing in the reactor 3b of the second voltage converter 10b increase together (see the fourth view from above of FIG. 2 and the second view from below of FIG. 2). A graph Ge in the first view from below of FIG. 2 shows total output electric power of the first voltage converter 10a and the second voltage converter 10b, and a graph Gd shows output electric power of the first voltage converter 10a. That is, the difference between the graph Ge and the graph Gd represents output electric power of the second voltage converter 10b. The total output (graph Ge) of the first and second voltage converters 10a, 10b follows load electric power with a delay of a predetermined time and an overshoot. The difference between the total output (graph Ge) of the first and second voltage converters 10a, 10b and load electric power (graph Gf) is adjusted with electric power charged in the smoothing capacitor 15 (see FIG. 1). The reason that a voltage VH (the third view from above of FIG. 2) of the high voltage end 18 of the two voltage converters 10a, 10b temporarily decreases is because the smoothing capacitor 15 discharges electric power so as to supplement a shortage of the total output (graph Ge) of the first and second voltage converters 10a, 10b with respect to load electric power. When electric charge of the smoothing capacitor 15 is restored, the voltage VH returns to original magnitude.

Since load electric power increases and the current IL1 flowing in the reactor 3a of the first voltage converter 10a increases (the fourth view from above of FIG. 2), the temperature T1 of the reactor 3a increases (the third view from below of FIG. 2). At time tx, the temperature T1 of the reactor 3a exceeds a temperature threshold Th. At this time, the current flowing in the second voltage converter 10b does not exceed a current threshold Ih. The controller 19 performs the processing of (2), that is, the processing in a case where the temperature (the temperature T1 of the reactor 3a) of the first voltage converter 10a becomes higher than the temperature threshold Th and the current flowing in the second voltage converter 10b (the current IL2 flowing in the reactor 3b) is lower than the current threshold Ih. At this time, the controller 19 continues the upper arm on fixing control on the second voltage converter 10b and releases the upper arm on fixing control on the first voltage converter 10a. Then, the controller 19 starts the switching control (first switching control) for switching the lower arm transistor 5a of the first voltage converter 10a with the first duty ratio and switching the upper arm transistor 4a of the first voltage converter 10a so as to become the reverse operation of the on and off operation of the lower arm transistor 5a. The controller 19 starts the first switching control at time t2. In FIG. 2, a time interval tp represents a control cycle of the drive signal (PWM signal) to each of the transistors 4a, 5a, and a time interval td represents an on time of the lower arm transistor 5a. td/tp corresponds to the first duty ratio.

In a period of time t2 to time t3, the lower arm transistor 5a of the first voltage converter 10a is turned on, and in the period, the current flowing in the reactor 3a of the first voltage converter 10a decreases and the temperature T1 of the reactor 3a decreases. In the period, the current IL2 flowing in the reactor 3b of the second voltage converter 10b is increased by the amount of decrease of the current of the reactor 3a, and the amount of decrease of the output of the first voltage converter 10a is supplemented with the second voltage converter 10b. Subsequently, the same also applies to a period of time t4 to time t5 and a period of time t6 to time t7. As a result, the temperature T1 of the reactor 3a of the first voltage converter 10a decreases to fall below the temperature threshold Th. In this way, the processing of (2) is performed, whereby it is possible to further suppress an increase in temperature of the reactor 3a of the first voltage converter 10a while maintaining electric power supplied to the load (motor 30).

In FIG. 2, a graph Ga shows temporal change in the current IL1 of the reactor 3a in a case where the first switching control is not started and the upper arm on fixing control is continued on the first voltage converter 10a. A graph Gb shows the current IL2 of the reactor 3b at this time. A graph Gc shows output electric power of the first voltage converter 10a at this time. As will be understood from comparison of the graphs Ga, Gb, Gc and the thick line graphs, the control (first switching control) of (2) is performed, whereby the current flowing in the first voltage converter 10a is decreased and the current flowing in the second voltage converter 10b is increased by the amount of decrease.

As described above, in (2), the controller 19 may perform the following second switching control, instead of continuing the upper arm on fixing control on the second voltage converter 10b. In the second switching control, the controller 19 releases the upper arm on fixing control on the second voltage converter 10b, switches the lower arm transistor 5b with the second duty ratio smaller than the first duty ratio, and switches the upper arm transistor 4b so as to become the reverse operation of the on and off operation of the lower arm transistor 5b. The first duty ratio is the duty ratio of the lower arm transistor 5a in the switching control (first switching control) on the first voltage converter 10a. Time charts of the transistors 4a, 5a, 4b, 5b at this time are shown in FIG. 3.

Figure 3:
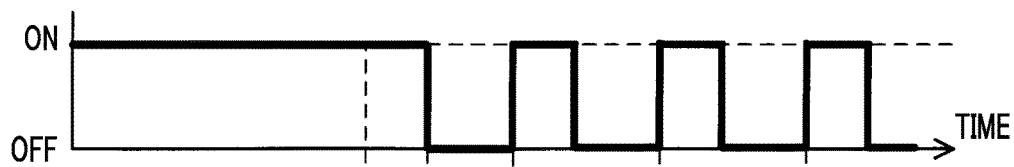
FIG. 3 is a time chart of the operations of the first and second voltage converters when the temperature of the reactor of the first voltage converter exceeds the temperature threshold (modification example)
Figure 3:
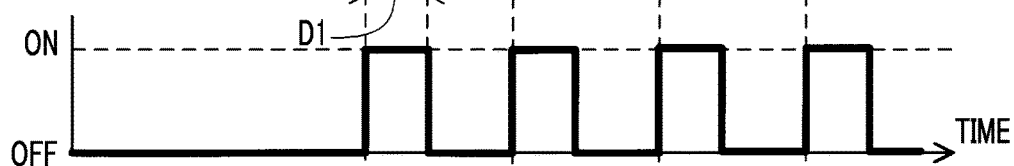
Figure 3:
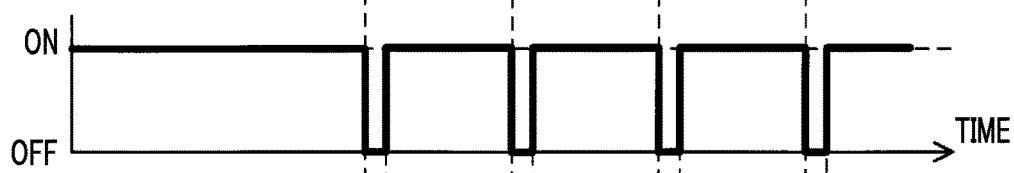
Figure 3:
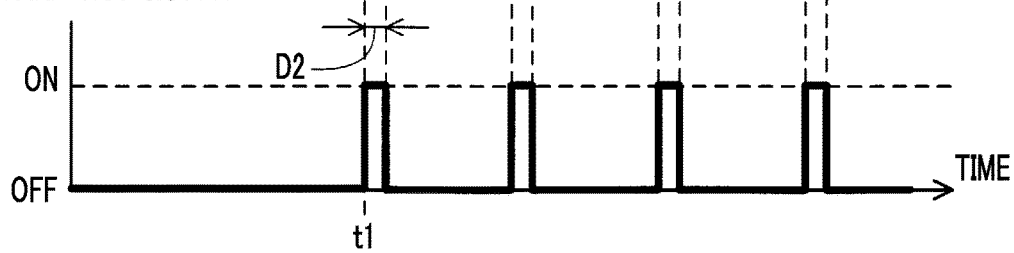

A first view from above of FIG. 3 is a time chart of the operation of the upper arm transistor 4a of the first voltage converter 10a. A second view from above of FIG. 3 is a time chart of the operation of the lower arm transistor 5a of the first voltage converter 10a. A second view from below of FIG. 3 is a time chart of the operation of the upper arm transistor 4b of the second voltage converter 10b. A first view from below of FIG. 3 is a time chart of the operation of the lower arm transistor 5b of the second voltage converter 10b. All horizontal axes represent time. Until time t1, the temperature of the reactor 3a of the first voltage converter 10a falls below the temperature threshold. It is assumed that, at time t1, the temperature of the reactor 3a exceeds the temperature threshold. Until time t1, the controller 19 performs the upper arm on fixing control on the first and second voltage converters 10a, 10b. That is, until time t1, the controller 19 fixes the upper arm transistors 4a, 4b of the first and second voltage converters 10a, 10b to be on and fixes the lower arm transistors 5a, 5b to be off. At time t1, detection is made that the temperature of the reactor 3a of the first voltage converter 10a exceeds the temperature threshold. At this time, detection is made that the current flowing in the reactor 3b of the second voltage converter 10b does not exceed the current threshold. That is, at time t1, detection is made that the temperature (the temperature of the reactor 3a) of the first voltage converter 10a becomes higher than the temperature threshold and the current flowing in the second voltage converter 10b is lower than the current threshold. Accordingly, the controller 19 releases the upper arm on fixing control on the first voltage converter 10a and starts control (first switching control) for switching the lower arm transistor 5a of the first voltage converter 10a with the first duty ratio and switching the upper arm transistor 4a so as to become the reverse operation of the on and off operation of the lower arm transistor 5a. In FIG. 3, a time W indicates a cycle of PWM control of a transistor. A time D1 is an on time of the lower arm transistor 5a. The first duty ratio becomes D1/W. The controller 19 releases the upper arm on fixing control on the second voltage converter 10b and starts the second switching control. That is, the controller 19 switches the lower arm transistor 5b with the second duty ratio smaller than the first duty ratio and switches the upper arm transistor 4b so as to become the reverse operation of the on and off operation of the lower arm transistor 5b. In FIG. 3, a time W indicates a cycle of PWM control of a transistor. A time D2 is an on time of the lower arm transistor 5b. The second duty ratio becomes D2/W. Since D1>D2, apparently, the second duty ratio <the first duty ratio. In a case where the above-described relationship of the duty ratios is satisfied, the current flowing in the reactor 3a of the first voltage converter 10a decreases to be lower than before the first and second switching control start, and an increase in temperature of the reactor 3a is further suppressed. Then, the amount of decrease of the output of the first voltage converter 10a is supplemented with the second voltage converter 10b. As a result, it is possible to maintain electric power supplied to the motor 30 in a state before the first and second switching control start.

The controller 19 may release the upper arm on fixing control and may start the second switching control, instead of maintaining the upper arm on fixing control on the second voltage converter 10b. However, it is most effective to maintain the upper arm on fixing control on the second voltage converter 10b in further suppressing an increase in temperature of the reactor 3a of the first voltage converter 10a.

Figure 4:
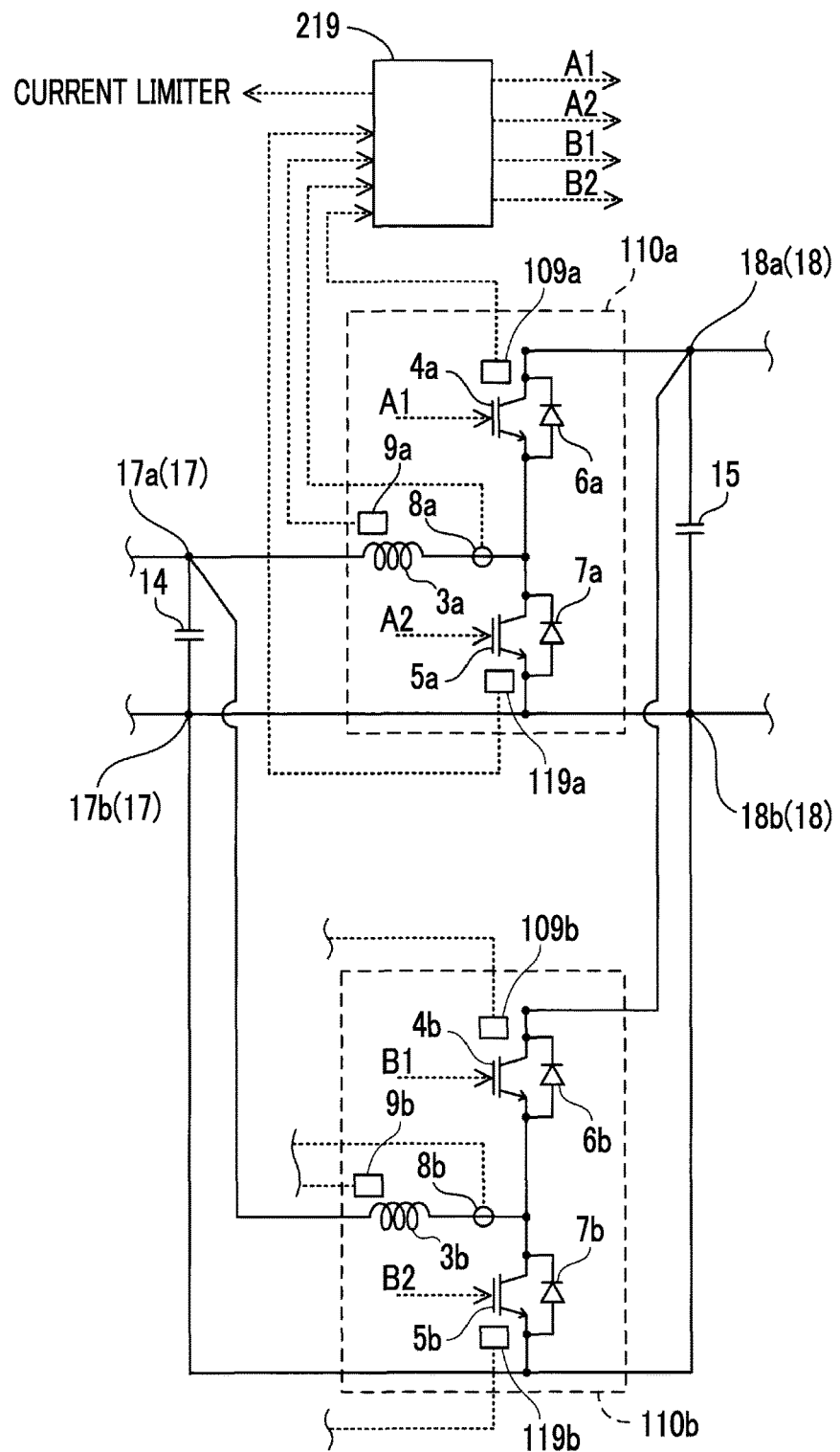
FIG. 4 is a block diagram of a voltage converter of a modification example.

Referring to FIG. 4, a modification example of a voltage converter will be described. FIG. 4 is a circuit diagram of a first voltage converter 110a and a second voltage converter 110b. The battery side from the low voltage end 17 and the inverter side from the high voltage end 18 are the same as those in FIG. 1, and thus, these are not shown. The first voltage converter 110a of the modification example includes three temperature sensors 9a, 109a, 119a. The temperature sensor 9a measures a temperature of the reactor 3a. The temperature sensor 109a measures a temperature of the upper arm transistor 4a. The temperature sensor 119a measures a temperature of the lower arm transistor 5a. Measurement results of the three temperature sensors 9a, 109a, 119a are sent to a controller 219. In the controller 219, a first temperature threshold corresponding to the reactor 3a, a second temperature threshold corresponding to the upper arm transistor 4a, and a third temperature threshold corresponding to the lower arm transistor 5a are stored. When the measurement value of one of the three temperature sensors 9a, 109a, 119a exceeds the corresponding temperature threshold, the controller 219 handles the measurement value as the temperature of the first voltage converter 10a and performs the processing of one of (1) and (2) described above. A power supply system including the voltage converters 110a, 110b and the controller 219 of the modification example can further prevent a plurality of parts of the first voltage converter 110a from being overheated.

The second voltage converter 110b also includes three temperature sensors 9b, 109b, 119b. The temperature sensor 9b measures a temperature of the reactor 3b. The temperature sensor 109b measures a temperature of the upper arm transistor 4b. The temperature sensor 119b measures a temperature of the lower arm transistor 5b. Measurement results of the three temperature sensors 9b, 109b, 119b are sent to the controller 219. The controller 219 also performs, on the second voltage converter 110b, processing of temperature management on the first voltage converter 110a. In FIG. 4, signal lines from the three temperature sensors 9b, 109b, 119b to the controller 219 are omitted halfway.

Points to note about the technique described in the example will be described. The temperature sensors 9a, 109a, 119a of the example are an example of a temperature acquisition unit. The temperature acquisition unit is typically a thermistor. The temperature acquisition unit may estimate the temperature of the first voltage converter 10a from a temperature of a refrigerant cooling the first voltage converter 10a. The current sensor 8a of the example is an example of a current acquisition unit. The upper arm transistors 4a, 4b of the example are an example of an upper arm element. The lower arm transistors 5a, 5b are an example of a lower arm element.

Although specific examples have been described above in detail, these are merely for illustration and are not intended to limit the claims. The technique described in the claims includes various modifications and alterations of the specific examples illustrated above. Technical features described in the specification or the drawings may be technically useful alone or in various combinations, and are not limited to the combinations as originally claimed. The technique illustrated in the specification or the drawings may concurrently achieve a plurality of objects, and technical significance thereof resides in achieving one of the objects.

What is claimed is:

1. A power supply system for an electric vehicle, the power supply system comprising:
    a battery;
    an inverter configured to supply alternating-current electric power to a motor for generating a driving force for the electric vehicle;
    a first voltage converter provided between the battery and the inverter, the first voltage converter being connected to the battery and the inverter;
    a second voltage converter provided between the battery and the inverter, the second voltage being connected to the battery and the inverter, and the second voltage being in parallel with the first voltage converter;
    a temperature acquisition unit configured to acquire a temperature of the first voltage converter;
    a current acquisition unit configured to acquire magnitude of a current flowing in the second voltage converter; and
    a controller, wherein:
    each of the first voltage converter and the second voltage converter includes a pair of first and second switching elements connected in series with each other, the pair of first and second switching elements being provided between a positive electrode end and a negative electrode end of the inverter, the first switching element being connected to the positive electrode end of the inverter and the second switching element being connected to the negative electrode end of the inverter, two diodes, each of which is connected in reversely parallel with a corresponding one of the first and second switching elements, and a reactor connected to a positive electrode end of the battery and a point at which the first and second switching elements are connected to each other; and
    the controller is configured to
        when upper arm on fixing control for fixing the first switching element connected to the positive electrode end of the inverter to be on and fixing the second switching element connected to the negative electrode end of the inverter to be off is performed on the first voltage converter and the second voltage converter,
        when the temperature of the first voltage converter becomes higher than a temperature threshold and the current flowing in the second voltage converter is higher than a current threshold, continue the upper arm on fixing control on the first and second voltage converters and reduce an output of the battery, and
        when the temperature of the first voltage converter becomes higher than the temperature threshold and the current flowing in the second voltage converter is lower than the current threshold, release the upper arm on fixing control on the first voltage converter and start a first switching control for switching the second switching element of the first voltage converter with a first duty ratio and for switching the first switching element of the first voltage converter so as to become a reverse operation of an on and off operation of the second switching element of the first voltage converter, and continue the upper arm on fixing control on the second voltage converter or release the upper arm on fixing control and start a second switching control for switching the second switching element of the second voltage converter with a second duty ratio smaller than the first duty ratio and for switching the first switching element of the second voltage converter so as to become a reverse operation of an on and off operation of the second switching element of the second voltage converter.

2. The power supply system according to claim 1, wherein:
    the first voltage converter includes a part temperature acquisition unit configured to acquire a temperatures of each of a plurality of parts; and
    when the temperature of one of the parts becomes higher than the temperature threshold corresponding to the part, the controller is configured to set the temperature of the part as the temperature of the first voltage converter.

3. The power supply system according to claim 1, wherein the temperature of the first voltage converter tends to become higher than a temperature of the second voltage converter.

* * * * *